(12) United States Patent
Chang et al.

(10) Patent No.: US 11,183,369 B2
(45) Date of Patent: Nov. 23, 2021

(54) FOCALIZED MICROWAVE PLASMA REACTOR

(71) Applicant: Industrial Technology Research Institute, Hsinchu (TW)

(72) Inventors: Chih-Chen Chang, New Taipei (TW); Yu-Wen Chi, Hsinchu County (TW); Kun-Ping Huang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 41 days.

(21) Appl. No.: 16/528,700

(22) Filed: Aug. 1, 2019

(65) Prior Publication Data

US 2020/0211825 A1    Jul. 2, 2020

(30) Foreign Application Priority Data

Dec. 27, 2018   (TW) .................................. 107147471

(51) Int. Cl.
   *H01J 37/32*  (2006.01)
(52) U.S. Cl.
   CPC .. *H01J 37/32229* (2013.01); *H01J 37/32247* (2013.01)
(58) Field of Classification Search
   USPC ............................. 118/723 MW; 156/345.41
   See application file for complete search history.

(56) References Cited

U.S. PATENT DOCUMENTS

| 4,866,346 | A | 9/1989 | Gaudreau et al. | |
|---|---|---|---|---|
| 5,954,882 | A | 9/1999 | Wild et al. | |
| 6,158,383 | A | 12/2000 | Watanabe et al. | |
| 9,574,270 | B2 | 2/2017 | Yoshikawa et al. | |
| 2012/0326803 | A1* | 12/2012 | Lee .......................... | H05H 1/46 333/137 |
| 2014/0158302 | A1 | 6/2014 | Ikeda et al. | |
| 2014/0230729 | A1* | 8/2014 | Brandon ............ | H01J 37/32192 118/723 MW |
| 2017/0040145 | A1* | 2/2017 | Brandon ............ | H01J 37/32192 |
| 2017/0183778 | A1* | 6/2017 | Asmussen ......... | H01J 37/32192 |
| 2018/0061681 | A1 | 3/2018 | Koshimizu et al. | |

FOREIGN PATENT DOCUMENTS

| CN | 206274508 | | 6/2017 |
|---|---|---|---|
| FR | 2820939 | * | 8/2002 |
| TW | 200522799 | | 7/2005 |
| TW | 201316845 | | 4/2013 |
| TW | I602213 | | 10/2017 |

OTHER PUBLICATIONS

Machine Translation FR2820939, Mahe et al (Year: 2002).*
"Office Action of Taiwan Counterpart Application", dated May 5, 2020, p. 1-p. 5.

(Continued)

*Primary Examiner* — Rakesh K Dhingra
(74) *Attorney, Agent, or Firm* — JCIPRNET (57) ABSTRACT

Provided is a focalized microwave plasma reactor. The reactor utilizes a cylindrical microwave resonant cavity of the quasi-$TM_{011}$ mode to focalize microwave power and to excite focalized microwave plasma for the processes of microwave plasma enhanced chemical vapour depositions.

8 Claims, 8 Drawing Sheets

(56) References Cited

OTHER PUBLICATIONS

X.J. Li et al., "A compact ellipsoidal cavity type microwave plasma reactor for diamond film deposition," Diamond and Related Materials, vol. 20, Issue 3, Mar. 2011, pp. 374-379.

M.Fünier et al., "Simulation and development of optimized microwave plasma reactors for diamond deposition, " Surface and Coatings Technology, vol. 116-119, Sep. 1999, pp. 853-862.

X.J. Li et al., "Design of novel plasma reactor for diamond film deposition," Diamond and Related Materials, vol. 20, Issue 4, Apr. 2011, pp. 480-484.

Hideak Yamada et al., "Model of Reactive Microwave Plasma Discharge for Growth of Single-Crystal Diamond," Japanese Journal of Applied Physics, vol. 50, Jan. 2011, pp. 1-7.

F Silva et al., "Microwave engineering of plasma-assisted CVD reactors for diamond deposition," Journal of Physics Condensed Matter, Sep. 2009, pp. 1-17.

K Hassouni et al., "Modelling of diamond deposition microwave cavity generated plasmas," Journal of Physics D: Applied Physics, vol. 43, Mar. 2010, pp. 1-47.

\* cited by examiner

FOCALIZED MICROWAVE PLASMA REACTOR

CROSS-REFERENCE TO RELATED APPLICATION

This application claims the priority benefit of Taiwan patent application serial no. 107147471, filed on Dec. 27, 2018. The entirety of the above-mentioned patent application is hereby incorporated by reference herein and made a part of this specification.

TECHNICAL FIELD

The technical field relates to a sort of microwave plasma reactor, and in particular, to a focalized microwave plasma reactor.

BACKGROUND

In general, microwave plasma enhanced chemical vapor deposition (MPECVD) is usually applied in a higher pressure of process, compared with that of etching process or of photoresist-ash process. At this higher pressure, plasma diffuses so hard that it always adheres to the inner walls of the process chamber. If it adheres to the center of the substrate and shapes like an ellipsoid, then the plasma is focalized and stable. However, if it adheres to the dielectric bell jar (i.e., the dielectric cover of vacuum chamber), then the plasma is defocused or unstable, which will negatively affect the MPECVD processes and even burn out the dielectric bell jar. These phenomena are described in the article "J. Phys. D: Appl. Phys. 43 (2010) 153001 (45 pp)".

To focalize the plasma, microwave plasma reactors based on a cylindrical microwave resonant cavity of $TM_{01n}$ modes (n=1, 2, 3, . . . ) are usually used to achieve the goal. There are several electric-field maxima in the $TM_{01n}$ cavity. One of them is located upon the surface of the substrate, however, there is always another one located in the vicinity of the center top of the dielectric bell jar. If the former excites and focalizes plasma upon the substrate surface under the condition that the latter does not excite plasma in the vicinity of the center top of the dielectric bell jar to disturb plasma focalization, then the plasma is focalized. Several fine-tune techniques help to keep plasma focalized, such as fine tuning the depth of substrate, the height of the substrate, the length of the cylindrical resonant cavity and so on.

SUMMARY

The disclosure relates to a focalized microwave plasma reactor, including: a cylindrical microwave resonant cavity of a quasi-$TM_{011}$ mode, enclosed by a metal bottom plate, a metal top cover and a cylindrical metal wall. The cylindrical microwave resonant cavity of the quasi-$TM_{011}$ mode comprises a plasma reaction chamber, enclosed by a metal substrate and a dielectric bell jar. A plurality of input ports are located at the junction or in the vicinity of the junction between the metal top cover and the cylindrical metal wall to excite the cylindrical microwave resonant cavity of the quasi-$TM_{011}$ mode.

The disclosure relates to a focalized plasma reactor using a cylindrical microwave resonant cavity of the quasi-$TM_{011}$ mode with only one electric-field maximum being alone located at the center of the substrate surface, upon which the plasma is always focalized.

To make the disclosure comprehensible, embodiments accompanied with figures are described in detail below.

DETAILED DESCRIPTION OF DISCLOSED EMBODIMENTS

Figure 1:
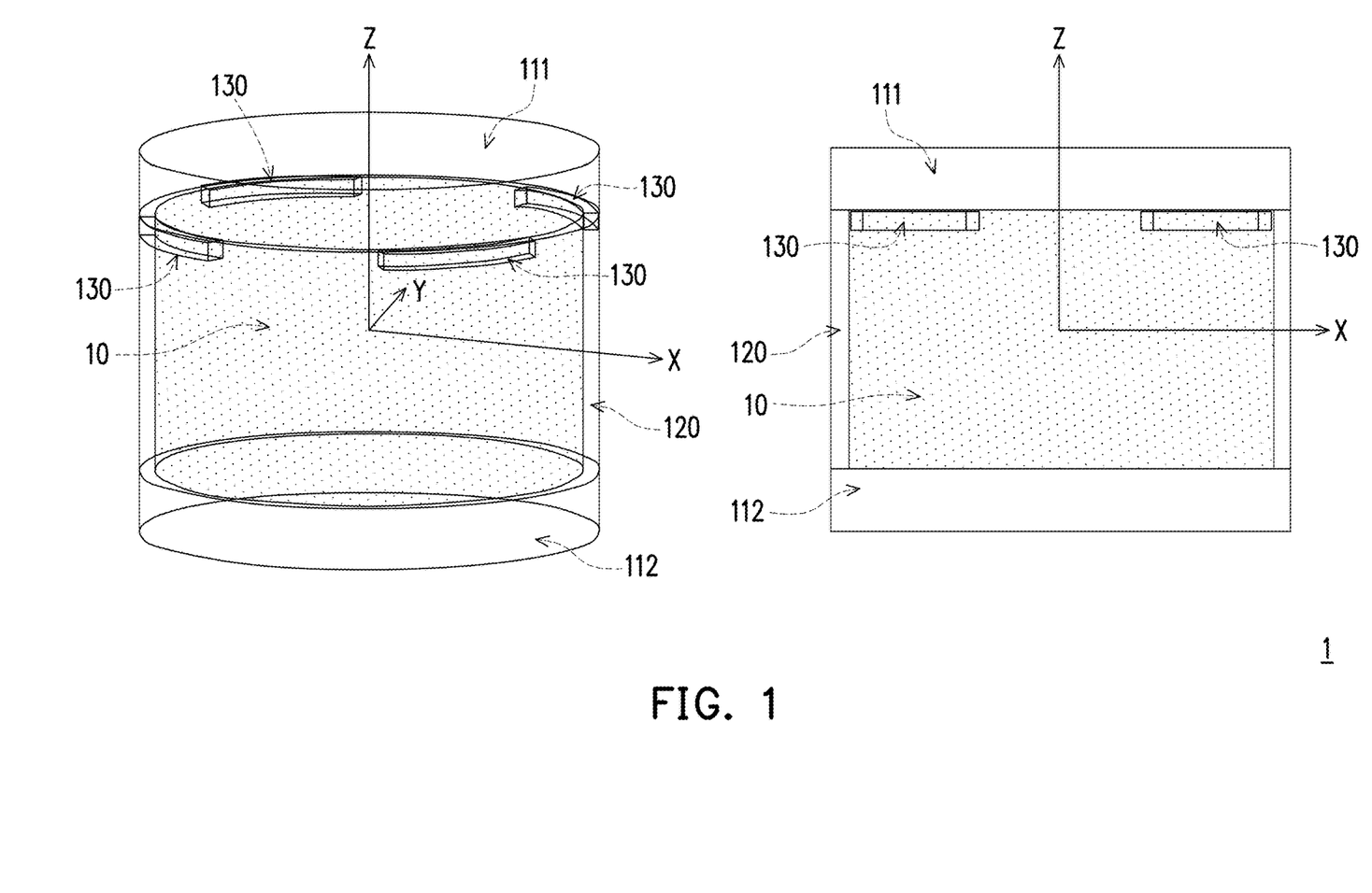
FIG. 1 is a side-perspective view normal to the XZ plane of a cylindrical microwave resonant cavity of the quasi-$TM_{011}$ mode according to an embodiment of the disclosure.
Figure 2A:
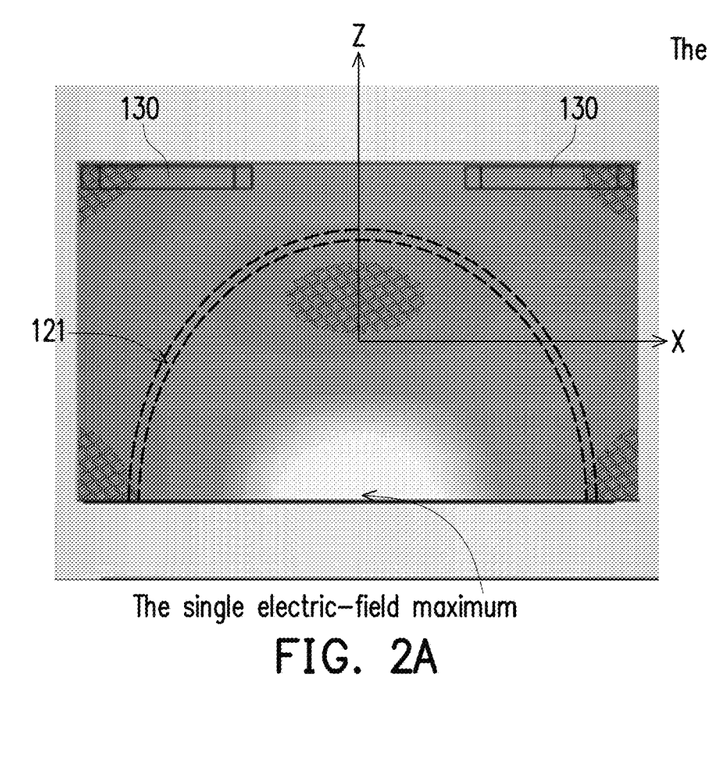
FIG. 2A is a simulation result of electric-field intensity distribution in the longitudinally cross-sectional plane (the XZ plane) of the cylindrical microwave resonant cavity of the quasi-$TM_{011}$ mode according to an embodiment of the disclosure.

The disclosure discloses a focalized microwave plasma reactor 1 using the cylindrical microwave resonant cavity of the quasi-TM011 mode 10, as shown in FIG. 1. According to the features of the quasi-TM011 mode, there is only one electric-field maximum located at the upper-surface center of the metal bottom plate 112 as shown in FIG. 2A. Therefore, the focalized microwave plasma reactor 1 disclosed may constantly focalized plasma because there is no other electric-field maxima elsewhere to disturb plasma focalization.

FIG. 1 is a side-perspective view normal to the XZ plane of a cylindrical microwave resonant cavity of the quasi-$TM_{011}$ mode according to an embodiment of the disclosure. The cylindrical microwave resonant cavity of the quasi-$TM_{011}$ mode 10 is enclosed by a metal top cover 111, a metal bottom plate 112 and a cylindrical metal wall 120, wherein, four slot antennas 130 are slotted in the vicinity of the junction between the metal top cover 111 and the cylindrical metal wall 120.

Figure 2B:
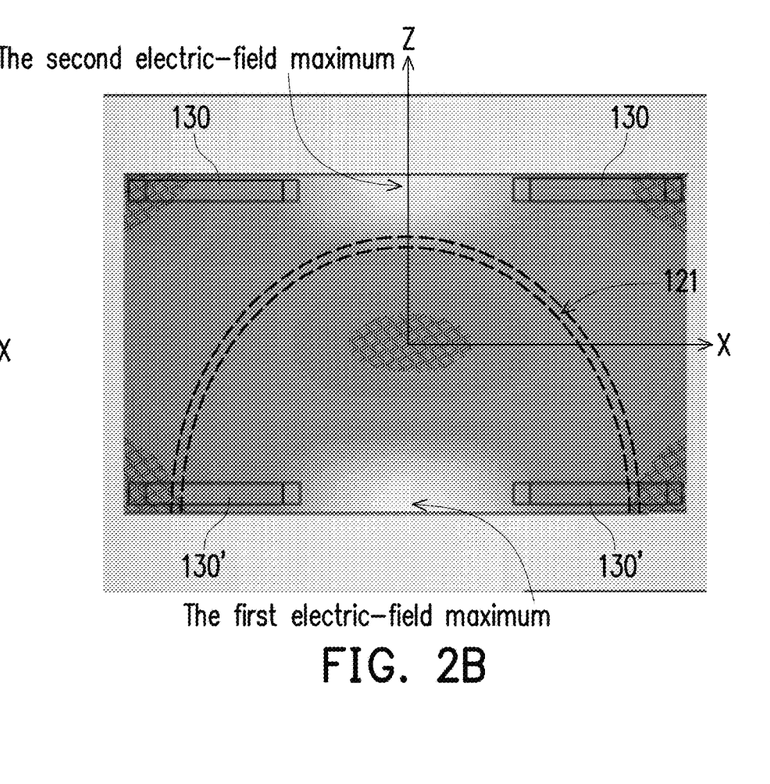
FIG. 2B is a simulation result of electric-field intensity distribution in the longitudinally cross-sectional (the XZ plane) of the cylindrical microwave resonant cavity of quasi-$TM_{011}$ mode according to an embodiment of the disclosure.

FIG. 2A is a simulation result of electric-field intensity distribution in the longitudinally cross-sectional plane (the XZ plane) of the cylindrical microwave resonant cavity of the quasi-$TM_{011}$ mode according to an embodiment of the disclosure. FIG. 2B is a simulation result of electric-field intensity distribution in the longitudinally cross-sectional (the XZ plane) of the cylindrical microwave resonant cavity of the quasi-$TM_{011}$ mode according to an embodiment of the disclosure. Referring to which, four slot antennas 130 are arranged to be in-phase to radiate microwave (e.g., the microwaves are radiated from the four slot antennas 130 in a manner of the same phase) into the cylindrical cavity such that the cylindrical the quasi-$TM_{011}$ mode is excited. The simulation result of electric-field intensity distribution in the XZ plane of the cylindrical microwave resonant cavity of quasi-$TM_{011}$ mode is shown in FIG. 2A, wherein, the areal brightness and darkness indicate high and low electric-field intensities respectively. Apparently, there is only a single electric-field maximum (the brightest point) which is located at the upper-surface center of the metal bottom plate 112. Obviously, the intensity of the electric field near the top of the dielectric bell jar 121 is so low or even zero that it is not likely to disturb plasma focalization. (Wherein the dotted semi-circle lines represent the position of longitudinal cross section of the dielectric bell jar 121.)

On the other hand, the counter part of the cylindrical microwave resonant cavity of the typical $TM_{011}$ mode according to an embodiment of the disclosure as shown in FIG. 2B. Different from that of the quasi-$TM_{011}$ mode, beside of the four input ports 130, other four input ports 130' are separately located in the vicinity of the junction between the metal bottom plate 112 and the cylindrical metal wall 120. Accordingly, the eight input ports 130 & 130' are arranged to be in-phase to radiate microwave (e.g., the microwaves are radiated from the eight input ports 130 & 130' in a manner of the same phase) into the cavity such that the typical cylindrical $TM_{011}$ mode is excited. FIG. 2B also shows the simulation result of electric-field intensity distribution in the XZ plane. It is obvious that there are two electric-field maxima (two brightest points in electric-field intensity distributions), the first maximum is located at the upper-surface center of the metal bottom plate 112, while the second one is located at the lower-surface center of the metal top cover 111. However, the electric field intensity in the vicinity of the top center of the dielectric bell jar 121 is enhanced by the second maximum, which is likely to excite plasma beneath the dielectric bell jar 121 and to destroy plasma focalizing on the substrate 112a.

In summary, the cylindrical microwave resonant cavity of the quasi-$TM_{011}$ mode has only one electric-field maximum, while the $TM_{011}$'s has two. Accordingly, the $TM_{012}$'s has three; the $TM_{013}$'s has four; and so on. A conclusion can be made that the cylindrical $TM_{01n}$ mode cavity (where n=1, 2, 3, . . . ) has n+1 electric-field maxima except that the cylindrical quasi-$TM_{011}$ mode cavity has only one electric-field maximum being located at the upper-surface center of the metal bottom plate 112 as shown in FIG. 2A. Because the focalized microwave plasma reactor 1 using the cylindrical microwave resonant cavity of the quasi-$TM_{011}$ mode has only one electric field maximum being located at the upper-surface center of the metal bottom plate 112 (or the substrate 112a) and because there is no other electric field maximum elsewhere, the possibility of plasma defocus is eliminated. Compared with the reactors using the $TM_{01n}$ resonant cavities, due to the presence of the other electric field maximum in the vicinity of the upper surface center of the dielectric bell jar 121, the plasmas are likely to be disturbed or to be defocused.

Figure 3:
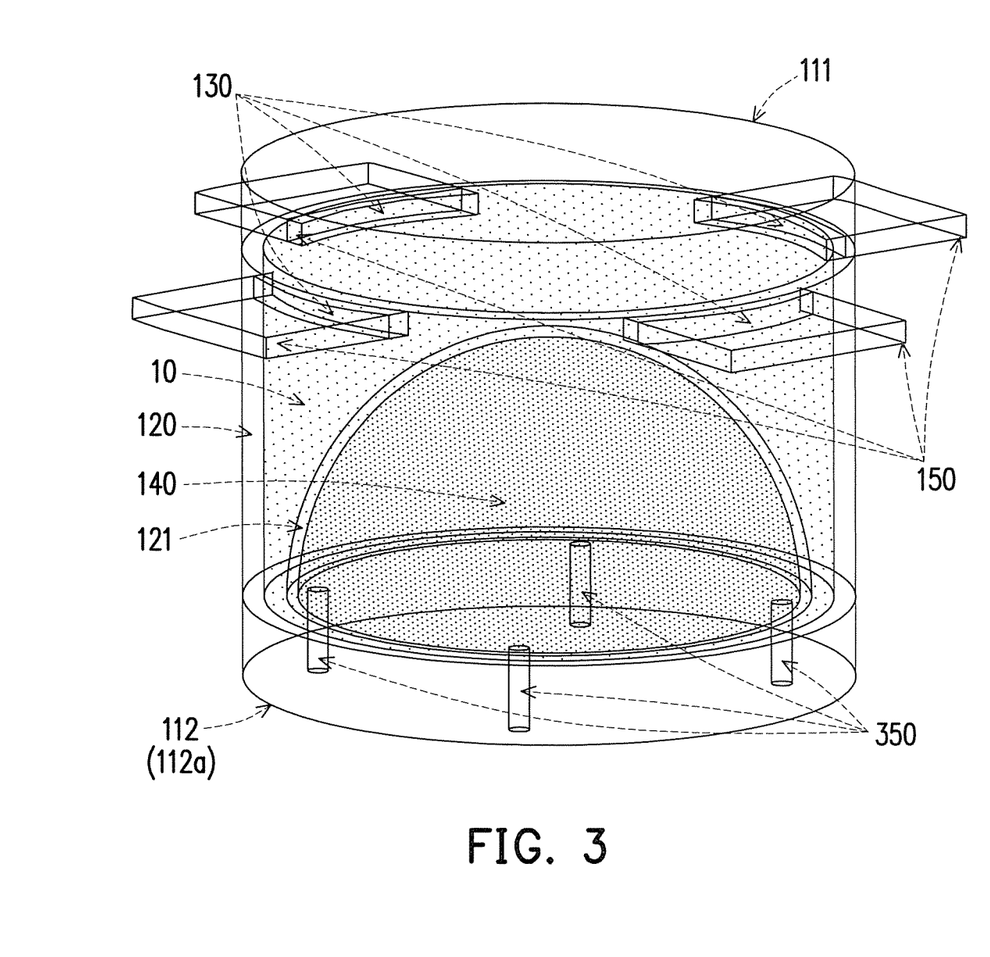
FIG. 3 is a schematic structural diagram of the focalized microwave plasma reactor 1 using the cylindrical microwave resonant cavity of the quasi-$TM_{011}$ mode 10 according to an embodiment of the disclosure.

FIG. 3 is a schematic structural diagram of the cylindrical microwave resonant cavity of the quasi-$TM_{011}$ mode 10 according to an embodiment of the disclosure. A schematic structural diagram as well as the first implementation of the disclosure of a focalized microwave plasma reactor 1 using the cylindrical microwave resonant cavity of the quasi-$TM_{011}$ mode 10 according to an embodiment of the disclosure is shown in FIG. 3. The focalized microwave plasma reactor 1 has a core object composed of the cylindrical microwave resonant cavity of the quasi-$TM_{011}$ mode 10, which is enclosed by a metal top cover 111 a metal bottom plate 112, and a cylindrical metal wall 120. In the present embodiment, the metal top cover 111 and the metal bottom plate 112 are in shape of circular plane. A plasma reaction chamber 140 is disposed in the cavity 10 and enclosed by the substrate 112a and the dielectric bell jar 121. Gas flow tunnels 350 including inlets and outlets are embedded in the substrate 112a and are encircling around the processing area of the substrate 112a. Devices like substrate heater, O-ring cooler and voltage bias units are also embedded in the substrate 112a (They are not depicted for briefness). At the junction between the metal top cover 111 and the cylindrical metal wall 120, four input ports 130 are responsible to radiate microwave into the cylindrical microwave resonant cavity of the quasi-$TM_{011}$ mode 10 to excite the cylindrical quasi-$TM_{011}$ mode, wherein the four input ports 130 are disposed on the inner side of the cylindrical metal wall 120. Microwaves are transmitted by four reduced-height rectangular waveguides 150 which are connected to the four input ports 130, and the transmitted microwaves are inputted into the cylindrical microwave resonant cavity of the quasi-$TM_{011}$ mode 10 via the four input ports 130. For briefness, the thickness, width and the length of each of the reduced-height rectangular waveguides 150 is not depicted, and the disclosure is not limited thereto.

Figure 4:
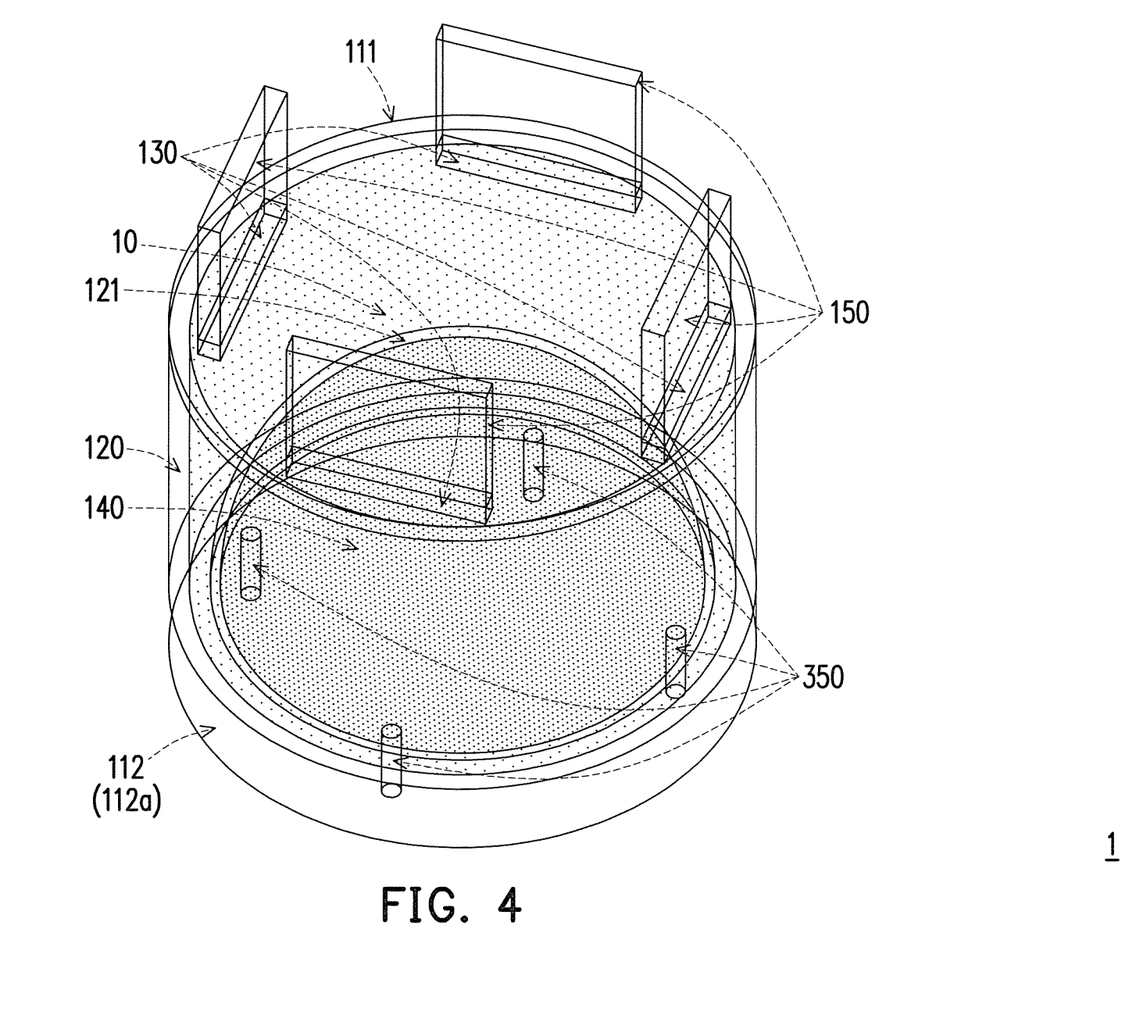
FIG. 4 is a schematic structural diagram of the focalized microwave plasma reactor 1 using the cylindrical microwave resonant cavity of the quasi-$TM_{011}$ mode 10 according to an embodiment of the disclosure.

FIG. 4 is also a schematic structural diagram of the cylindrical microwave resonant cavity of the quasi-$TM_{011}$ mode 10 according to an embodiment of the disclosure. A schematic structural diagram as well as the first implementation of the disclosure of a focalized microwave plasma reactor 1 using the cylindrical microwave resonant cavity of the quasi-$TM_{011}$ mode 10 according to an embodiment of the disclosure is shown in FIG. 4. Like FIG. 3, vacuum device units are embedded in the substrate 112a. In the vicinity of the junction between the metal top cover 111 and the cylindrical metal wall 120, four input ports 130 are responsible to radiate microwave into the cylindrical microwave resonant cavity of the quasi-$TM_{011}$ mode 10 to excite the cylindrical quasi-$TM_{011}$ mode, wherein the four input ports 130 are disposed through the metal top cover 111. Microwaves are transmitted by the four reduced-height rectangular waveguides 150 which are connected to the four input ports 130, and the transmitted microwaves are inputted into the cylindrical microwave resonant cavity of the quasi-$TM_{011}$ mode 10 via the four input ports 130. Also, for briefness, the thickness, width and the length of each of the reduced-height rectangular waveguides 150 is not depicted, and the disclosure is not limited thereto.

Figure 5:
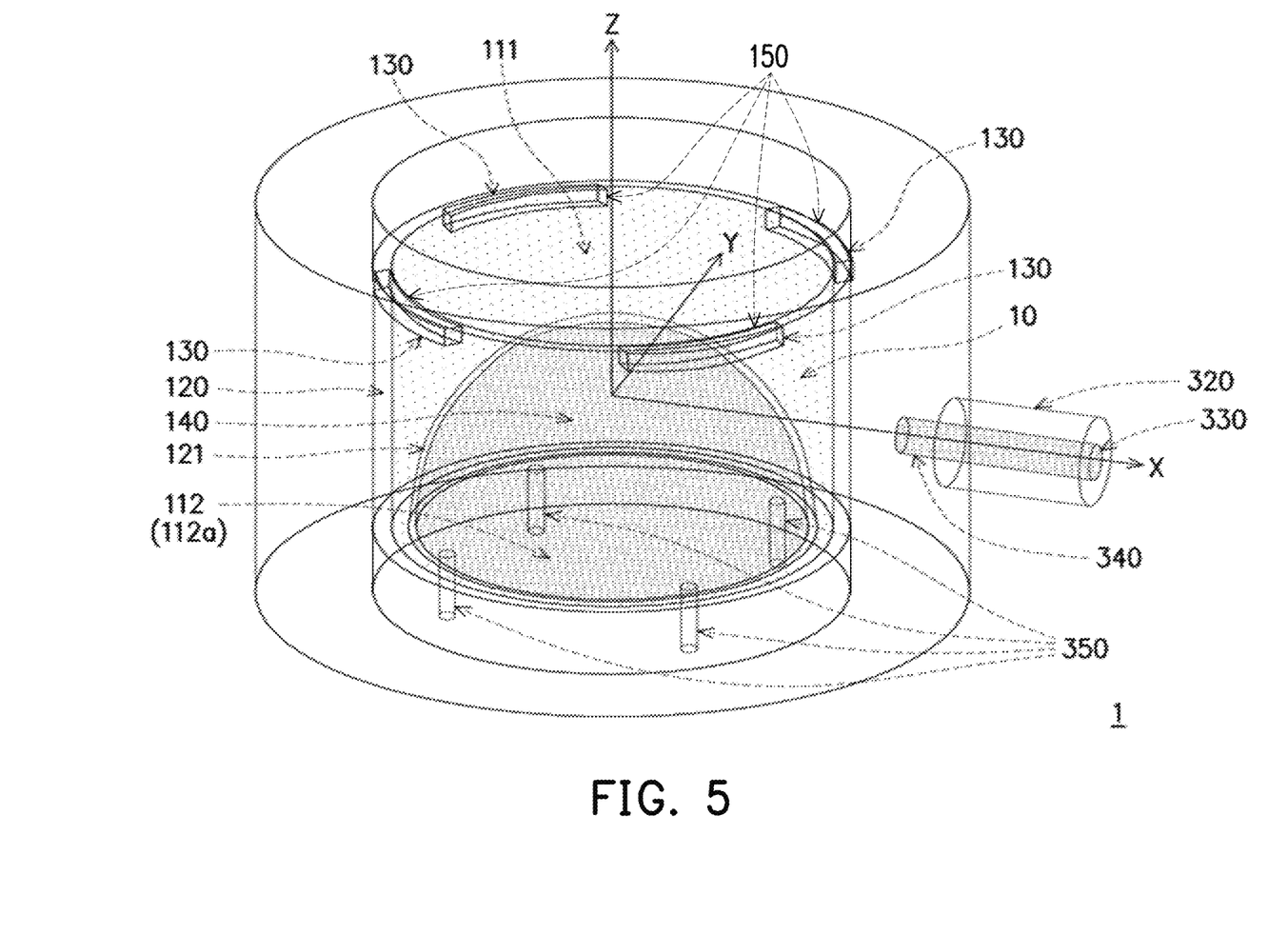
FIG. 5 is a schematic structural diagram of the focalized microwave plasma reactor 1 using the cylindrical microwave resonant cavity of the quasi-$TM_{011}$ mode 10 according to an embodiment of the disclosure.

FIG. 5 is another schematic structural diagram of the cylindrical microwave resonant cavity of the quasi-$TM_{011}$ mode 10 according to an embodiment of the disclosure. A schematic structural diagram as well as the first implementation of the disclosure of a focalized microwave plasma reactor 1 using the cylindrical microwave resonant cavity of the quasi-$TM_{011}$ mode 10 according to an embodiment of the disclosure is shown in FIG. 5. Like FIG. 3, vacuum device units are embedded in the substrate 112a. At the junction or in the vicinity of the junction between the metal top cover 111 and the cylindrical metal wall 120, four input ports 130 are set to make the cylindrical resonant cavity 10 and the annular rectangular waveguide 150 connected through.

Microwave is transmitted into the annular rectangular waveguide 150 by a coaxial waveguide 320, wherein the inner metal axis 330 is partly inserted into the annular rectangular waveguide 150 as to be a monopole antenna 340 and to excite rectangular $TE_{10}$ mode in the annular rectangular waveguide 150. The four input ports 130 are arranged to be in-phase to radiate microwave (e.g., the microwaves are radiated from the four input ports 130 in a manner of the same phase) into the cylindrical resonant cavity 10 and to excite the quasi-$TM_{011}$ mode therein. For briefness, the thickness of the metal walls of the annular rectangular waveguide 150 and that of the coaxial waveguide 320 are not depicted, and the disclosure is not limited thereto.

To test the stability of the plasma, microwave power is transmitted into the plasma reactor 1 from the end of the coaxial waveguide 320. The plasma reaction chamber 140 is kept at one atmospheric pressure and filled with air. At this high pressure, the temperature at plasma center may reach thousands of degrees in Celsius. If the plasma is unstable or defocused, it should adhere to and burn out the dielectric bell jar 121. However, the test result shows that the dielectric bell jar 121 remains intact after the MPECVD process being completed.

Figure 6:
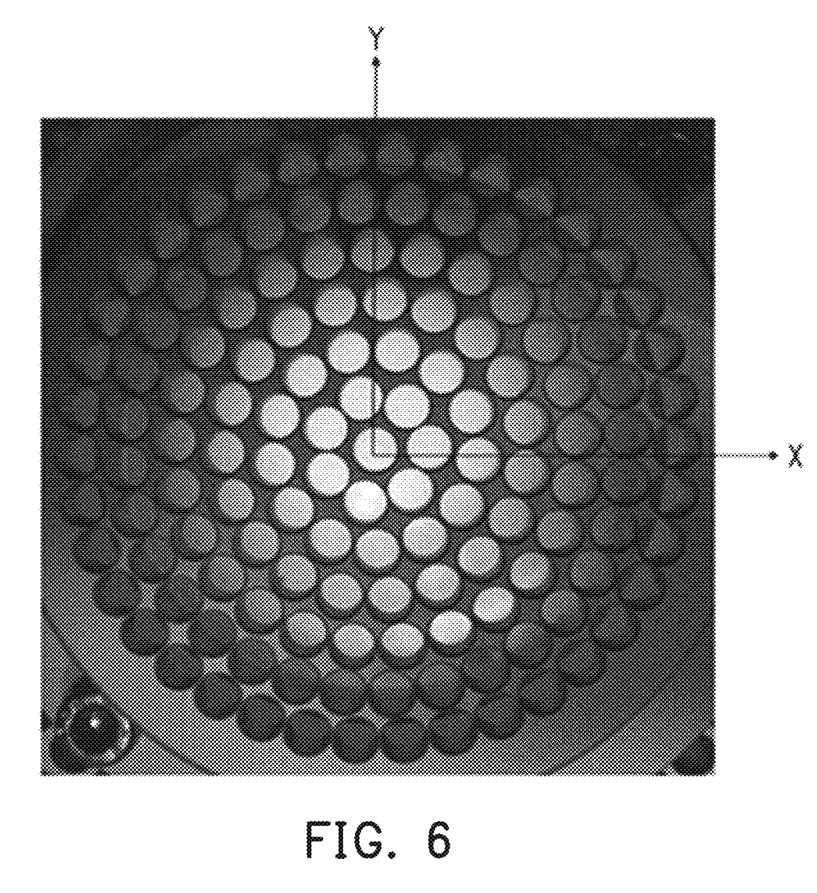
FIG. 6 is a photograph of the focalized plasma verified under certain conditions according to an embodiment of the disclosure.

A photograph of plasma status verified by an embodiment of the disclosure and the foregoing conditions is shown by FIG. 6. The verification result shows the dielectric bell jar 121 remains intact for a long time, i.e., it shows that the plasma is stable and focalized on the substrate 112a.

The main structural parameters of the present embodiment are as follows: the cylindrical quasi-$TM_{011}$ mode cavity 10 has an inner diameter of 130 mm; the cylindrical metal wall 120 has a height of 78 mm; the input ports 130 have a length of 61 mm, a width of 5 mm and a depth of 5 mm which is equal to the thickness of the cylindrical metal wall 120; and the microwave has a central frequency of 2.45 GHz with a 50 MHz bandwidth.

In an embodiment, the inner diameter of the cylindrical microwave resonant cavity of quasi-$TM_{011}$ mode 10 is equal to that of the cylindrical waveguide of $TM_{011}$ mode. However, the inner height of the cylindrical resonant cavity of the quasi-$TM_{011}$ mode 10 is between one quarter wavelength and one half wavelength of the cylindrical waveguide that transmits microwave $TM_{01}$ mode.

Figure 7:
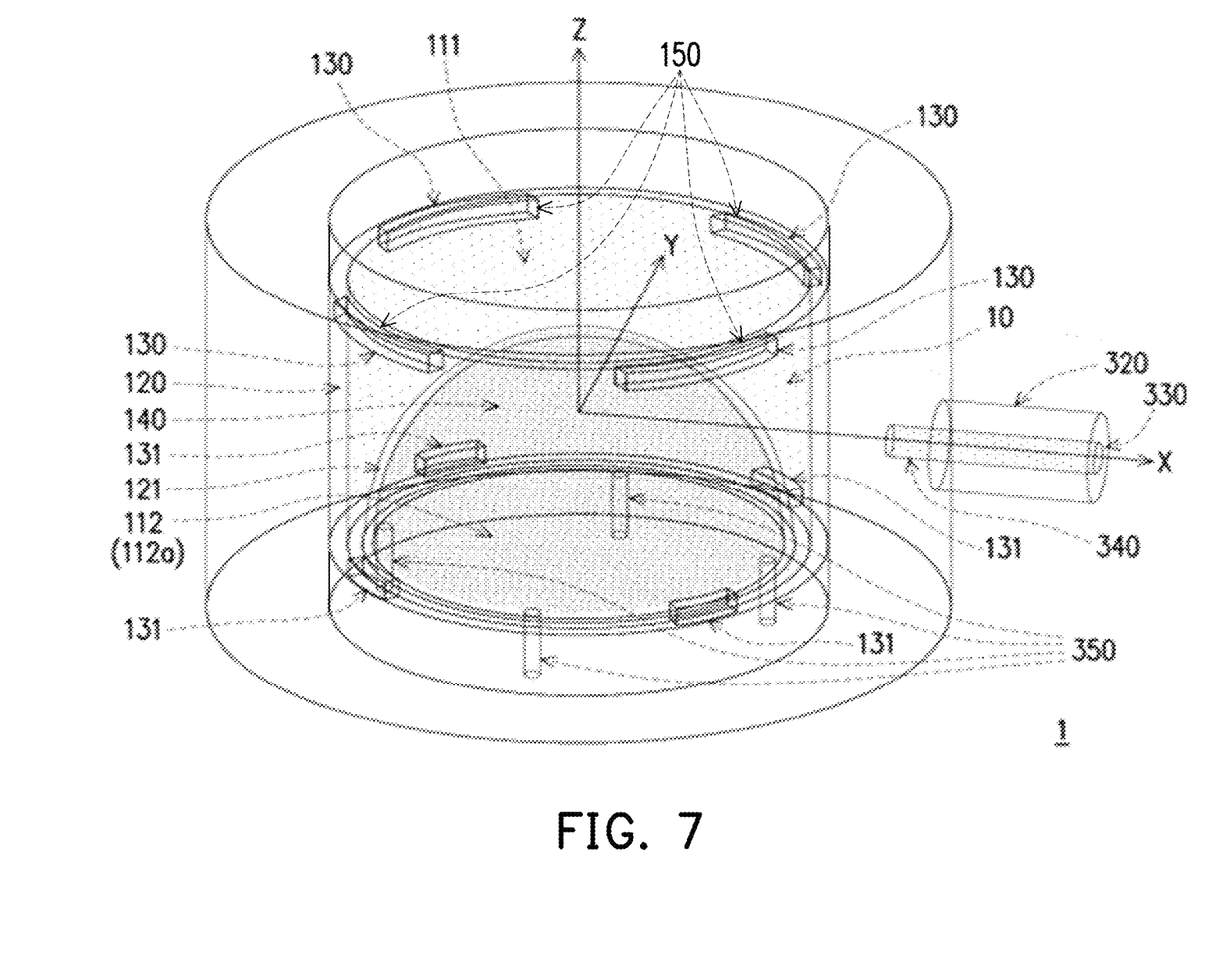
FIG. 7 is a schematic structural diagram of a cylindrical microwave resonant cavity of the quasi-$TM_{011}$ mode according to an embodiment of the disclosure.

FIG. 7 is a schematic structural diagram of a cylindrical microwave resonant cavity of the quasi-$TM_{011}$ mode according to an embodiment of the disclosure. Like FIG. 5, FIG. 7 is another schematic structural diagram of the second implementation, as illustrated in FIG. 5, of the disclosure of a focalized microwave plasma reactor 1 using the cylindrical microwave resonant cavity of quasi-$TM_{011}$ mode 10. The focalized microwave plasma reactor 1 is structurally the same as the first implementation except for four auxiliary slot antennas 131 slotted in the vicinity of the junction between the metal bottom plate 112 and the cylindrical metal wall 120. The length of the four auxiliary input ports 131 is made smaller than that of the four slot antennas 130. Under the condition of without disturbing plasma focalization, the purpose for setting the auxiliary input ports 131 is to adjust the electric-field intensity distributions upon the surface of the substrate 112a, from a circular pattern to a square one, so as to enlarge the plasma processing area, especially for square workpieces.

Figure 8:
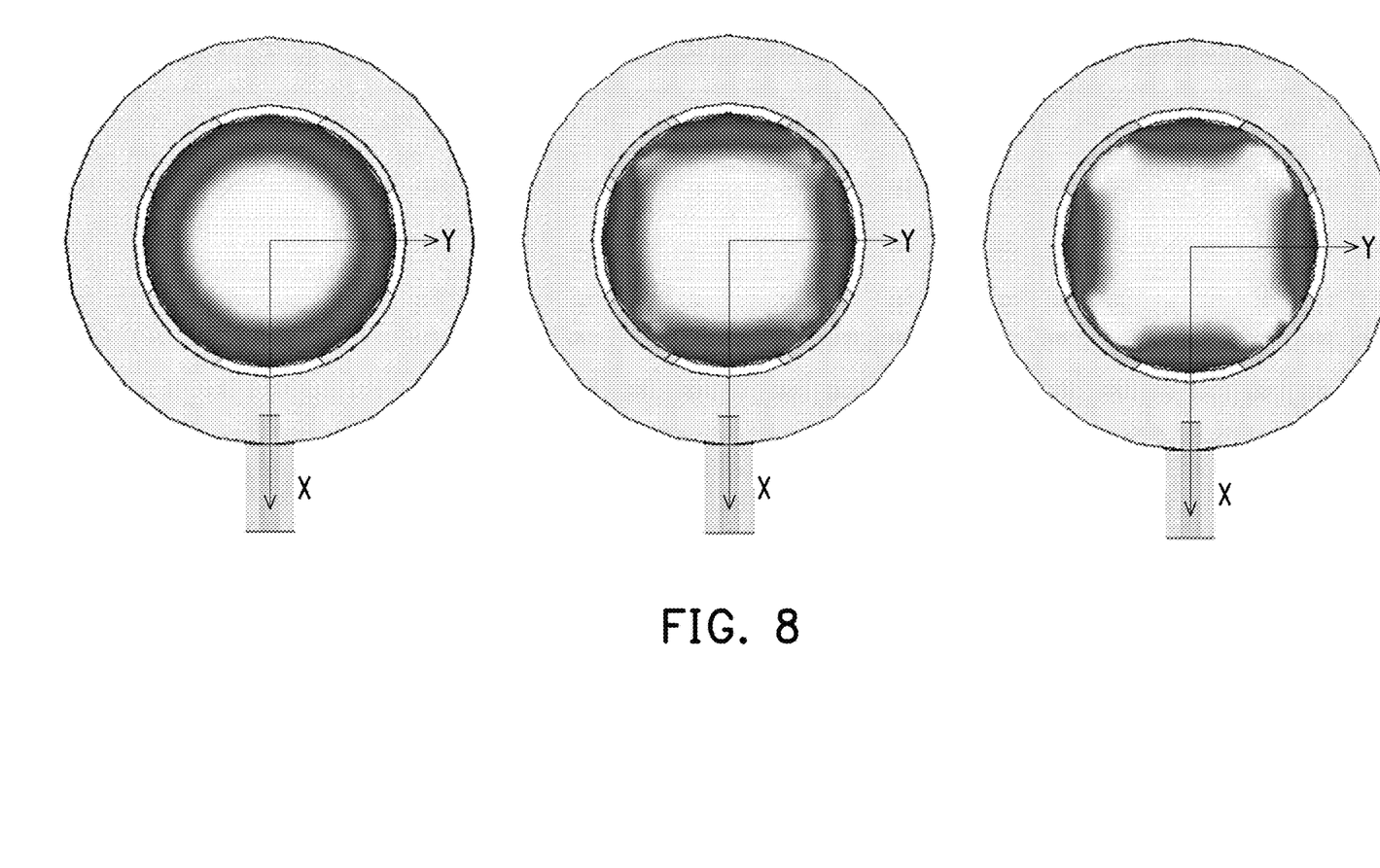
FIG. 8 is a simulation result of electric-field intensity distributions on the substrate surface according to an embodiment of the disclosure.

A simulation result of electric-field intensity distribution upon the substrate 112a according to an embodiment of the disclosure is shown in FIG. 8. If the length of the four auxiliary input ports 131 is zero, the electric-field intensity distribution upon the substrate 112a is shown as the left part of the figure; if the length of the four auxiliary input ports 131 is four fifths of the length of the four input ports 130, the distribution is shown as the middle part of the figure; and if the length of the four auxiliary input ports 131 is equal to that of the four input ports 130, the distribution is shown the right part of the figure. It is obvious that by adjusting the slotted length of the four auxiliary input ports 131, the electric-field intensity distributions upon the substrate 112a can be extended so as to enlarge the plasma processing area.

In summary, according to the focalized microwave plasma reactor 1 using the cylindrical quasi-$TM_{011}$ mode cavity disclosed in the embodiments of the disclosure, there is only one electric-field maximum being located at the surface center of the substrate and no one else, such that the plasma is always kept focalized on the substrate. Accordingly, the substrate and the cavity bottom plate can be the same object, such that the plasma processing area will not be limited by any fine-tune mechanism constructed on the substrate because in this disclosure no fine-tune mechanism is needed.

Although the disclosure has been disclosed with the foregoing embodiments, it is not intended to limit the disclosure, and it is possible for any person of ordinary skill in the art to make some modifications and refinements without departing from the spirit and scope of the disclosure. Therefore, the scope of protection of the disclosure should be defined by the scope of the appended claims.

What is claimed is:

1. A focalized microwave plasma reactor, comprising:
   a cylindrical microwave resonant cavity of a quasi-$TM_{011}$ mode, enclosed by a metal bottom plate, a metal top cover and a cylindrical metal wall, wherein
   the cylindrical microwave resonant cavity of the quasi-$TM_{011}$ mode comprises a plasma reaction chamber, the plasma reaction chamber being enclosed by a metal substrate and a dielectric bell jar, wherein
   a plurality of input ports are located at the junction or proximate the junction between the metal top cover and the cylindrical metal wall, and wherein
   a plurality of auxiliary input ports are located at the junction or proximate the junction between the metal bottom plate and the cylindrical metal wall.

2. The focalized microwave plasma reactor according to claim 1, wherein
   an inner diameter of the cylindrical microwave resonant cavity of the quasi-$TM_{011}$ mode is equal to an inner diameter of a cylindrical waveguide which transmits a cylindrical microwave $TM_{01}$ waveguide mode, and
   an inner height of the cylindrical microwave resonant cavity of the quasi-$TM_{011}$ mode is a value between one quarter wavelength to one half wavelength of the cylindrical waveguide which transmits the cylindrical microwave $TM_{01}$ waveguide mode.

3. The focalized microwave plasma reactor according to claim 1, wherein the metal bottom plate and the metal substrate are the same object.

4. The focalized microwave plasma reactor according to claim 1, wherein the cylindrical quasi-$TM_{011}$ microwave mode has only one electric-field maximum, and the electric-field maximum is located at the surface center of the metal bottom plate.

5. The focalized microwave plasma reactor according to claim 1, wherein the plurality of the input ports are arranged to be in-phase to radiate microwave into the cylindrical microwave resonant cavity of the quasi-$TM_{011}$ mode.

6. The focalized microwave plasma reactor according to claim 1, wherein the plurality of the auxiliary input ports are arranged to be in-phase to radiate microwave into the cylindrical microwave resonant cavity of the quasi-$TM_{011}$ mode.

7. The focalized microwave plasma reactor according to claim 1, wherein the lengths of the plurality of the auxiliary input ports are smaller than the lengths of the plurality of the input ports.

8. The focalized microwave plasma reactor according to claim 1, wherein
 a reduced-height rectangular waveguide is connected to each of the input ports, wherein a microwave is transmitted by each of the reduced-height rectangular waveguides into the cylindrical microwave resonant cavity of the quasi-$TM_{011}$ mode through the input ports, such that the cylindrical quasi-$TM_{011}$ mode is excited.

* * * * *